(12) United States Patent
Ahn

(10) Patent No.: US 8,163,617 B2
(45) Date of Patent: Apr. 24, 2012

(54) VERTICAL CHANNEL TYPE NON-VOLATILE MEMORY DEVICE AND METHOD FOR FABRICATING THE SAME

(75) Inventor: Jung-Ryul Ahn, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/832,650

(22) Filed: Jul. 8, 2010

(65) Prior Publication Data
US 2011/0024818 A1 Feb. 3, 2011

(30) Foreign Application Priority Data
Aug. 3, 2009 (KR) .......................... 10-2009-0071403

(51) Int. Cl.
*H01L 21/336* (2006.01)

(52) U.S. Cl. ................................. 438/259; 257/E21.41

(58) Field of Classification Search .................. 438/206, 438/259
See application file for complete search history.

(56) References Cited

U.S. PATENT DOCUMENTS
7,679,133 B2 * 3/2010 Son et al. ...................... 257/328
7,696,559 B2 * 4/2010 Arai et al. ..................... 257/316
* cited by examiner

*Primary Examiner* — Chandra Chaudhari
(74) *Attorney, Agent, or Firm* — IP & T Group LLP

(57) ABSTRACT

A method for fabricating a vertical channel type non-volatile memory device including forming a source region, alternately forming a plurality of interlayer dielectric layers and a plurality of conductive layers for a gate electrode over a substrate with the source region formed therein, forming a trench exposing the source region by etching the plurality of interlayer dielectric layers and the plurality of conductive layers for a gate electrode, and siliciding the conductive layers for a gate electrode and the source region that are exposed through the trench.

8 Claims, 6 Drawing Sheets

VERTICAL CHANNEL TYPE NON-VOLATILE MEMORY DEVICE AND METHOD FOR FABRICATING THE SAME

CROSS-REFERENCE TO RELATED APPLICATIONS

The present application claims priority of Korean Patent Application No. 10-2009-0071403, filed on Aug. 3, 2009, which is incorporated herein by reference in its entirety.

BACKGROUND OF THE INVENTION

The disclosed embodiments relate to a non-volatile memory device and a fabrication method thereof, and more particularly, to a vertical channel type non-volatile memory device and a fabrication method thereof.

A non-volatile memory device maintains data stored therein although a power supply is cut off. As the current technology reaches its limitation in improving the integration degree of a memory device having a two-dimensional structure where a memory device is fabricated in a single layer over a silicon substrate, a non-volatile memory device having a three-dimensional structure where memory cells are stacked vertically over a silicon substrate is desired.

Hereafter, a method for fabricating a typical non-volatile memory device having a three-dimensional structure and problems thereof will be described in detail with reference to the accompanying drawings.

FIGS. 1A to 1C are perspective views illustrating a process of fabricating a typical vertical channel type non-volatile memory device. Referring to FIG. 1A, a source region S is formed in a substrate 10. Subsequently, a lower selection transistor (LST), a plurality of memory cells MC, and an upper selection transistor (UST) are sequentially stacked along each channel CH protruding from the substrate 10 with the source region S formed therein.

Herein, channels CH are buried in a plurality of interlayer dielectric layers 11 and a plurality of conductive layers 12 for a gate electrode that are alternately formed on each other. Also, although not illustrated in the drawing, a gate insulation layer is interposed between the channels CH and the conductive layers 12 for a gate electrode of the lower selection transistor and the upper selection transistor. Also, a charge blocking layer, a charge trapping layer, and a tunnel insulation layer are interposed between the channels CH and the conductive layers 12 for a gate electrode of the memory cells MC.

As described above, the plurality of memory cells MC connected in series between the upper selection transistor and the lower selection transistor form one string, and the string is disposed vertically with respect to the substrate 10.

Referring to FIG. 1B, a plurality of memory blocks MB are separated one from another by etching the plurality of the interlayer dielectric layers 11 and the conductive layers 12 for a gate electrode thereby forming etched interlayer dielectric layers 11A and etched conductive layers 12A, respectively. Herein, a plurality of strings constituting the memory blocks MB are coupled in parallel with the source region S.

Referring to FIG. 1C, the plurality of the interlayer dielectric layers 11A and the plurality of the conductive layers 12A for a gate electrode are patterned in tiers, such that surfaces of each of the plurality of the conductive layers 12 for a gate electrode are exposed. The exposure is intended to form contact plugs to be coupled with the surfaces of the plurality of the conductive layers 12 for a gate electrode in a subsequent process. The patterned interlayer dielectric layers 11A and the patterned conductive layers 12A are referred to as interlayer dielectric layer patterns 11B and conductive layer patterns 12B, hereafter. Accordingly, the plurality of the conductive layer patterns 12B are exposed in each layer.

Although not illustrated in the drawing, a process for forming contact plugs, bit lines, and word lines is subsequently performed.

According to the conventional technology described above, the integration degree of a memory device may be improved by stacking a plurality of memory cells MC along the channels CH protruding vertically with respect to the substrate 10.

However, the lower selection transistor, the memory cells MC, and the upper selection transistor are formed after the plurality of the interlayer dielectric layers 11 and the conductive layers 12 for a gate electrode are alternately stacked. Thus, a gate electrode including a silicide layer cannot be formed.

In other words, since the material for forming the conductive layers 12 for a gate electrode is limited to a polysilicon layer, there is a limitation in reducing the resistance of a source select line, a word line, and a drain select line. Therefore, loading time increases when the memory device is driven, and accordingly, there is concern that the driving speed is decreased.

Also, the high resistance of the source region S decreases the characteristics of the memory device. The conventional technology performs an ion implantation process in the source region S to resolve the problem. However, although the ion implantation process is performed, there is a limitation in decreasing a resistance value of the source region S because the source region S has resistance of hundreds of ohm/unit area. Also, although a method of forming a contact coupled with the source region S is considered to reduce the resistance of the source region S, the object of increasing an integration degree of the memory device is frustrated due to the area needed for forming the contact.

SUMMARY OF THE INVENTION

An embodiment of the present invention is directed to a vertical channel type non-volatile memory device with a source region and gate electrodes of memory cells that are silicided, and a fabrication method thereof.

In accordance with an embodiment of the present invention, there is provided a method for fabricating a vertical channel type non-volatile memory device, which includes: alternately forming a plurality of interlayer dielectric layers and a plurality of conductive layers for a gate electrode over a substrate, forming a trench exposing a source region by etching the plurality of interlayer dielectric layers and the plurality of conductive layers for a gate electrode, and siliciding the conductive layers for a gate electrode and the source region that are exposed through the trench.

In accordance with another embodiment of the present invention, there is provided a method for fabricating a vertical channel type non-volatile memory device, which includes: forming a source region, alternately forming a plurality of interlayer dielectric layers and a plurality of conductive layers for a gate electrode over a substrate with the source region formed therein, forming a trench exposing the source region by etching the plurality of interlayer dielectric layers and the plurality of conductive layers for a gate electrode, and siliciding the conductive layers for a gate electrode and the source region that are exposed through the trench.

In accordance with another embodiment of the present invention, there is provided a vertical channel type non-volatile memory device, which includes: a source region, a channel configured to be coupled with the source region and protruding from a substrate, and a plurality of memory cells stacked along the channel, wherein the source region and a gate electrode of each memory cell include a silicided portion.

DESCRIPTION OF SPECIFIC EMBODIMENTS

Figure 1A:
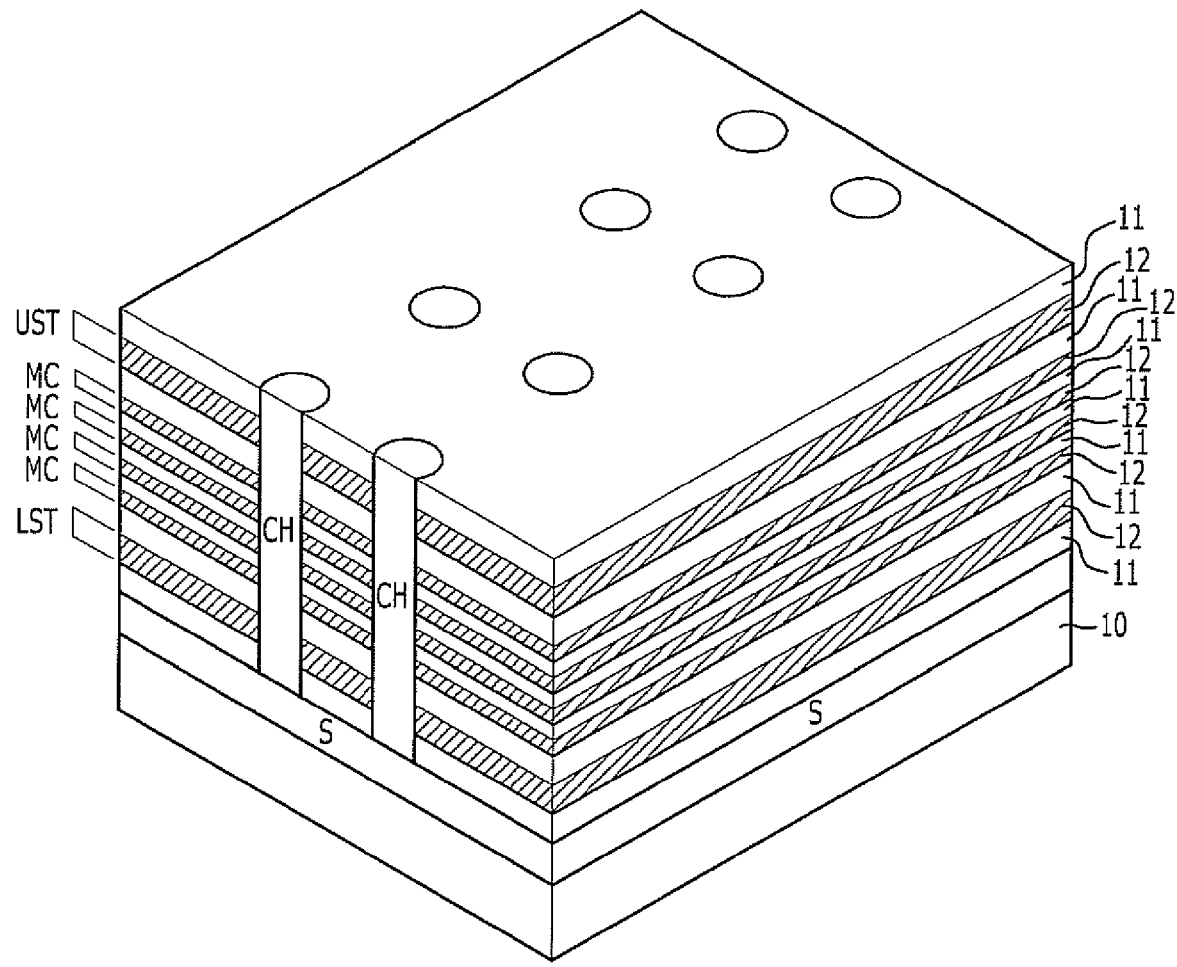
FIGS. 1A to 1C are perspective views illustrating a method for fabricating a typical vertical channel type non-volatile memory device.
Figure 1B:
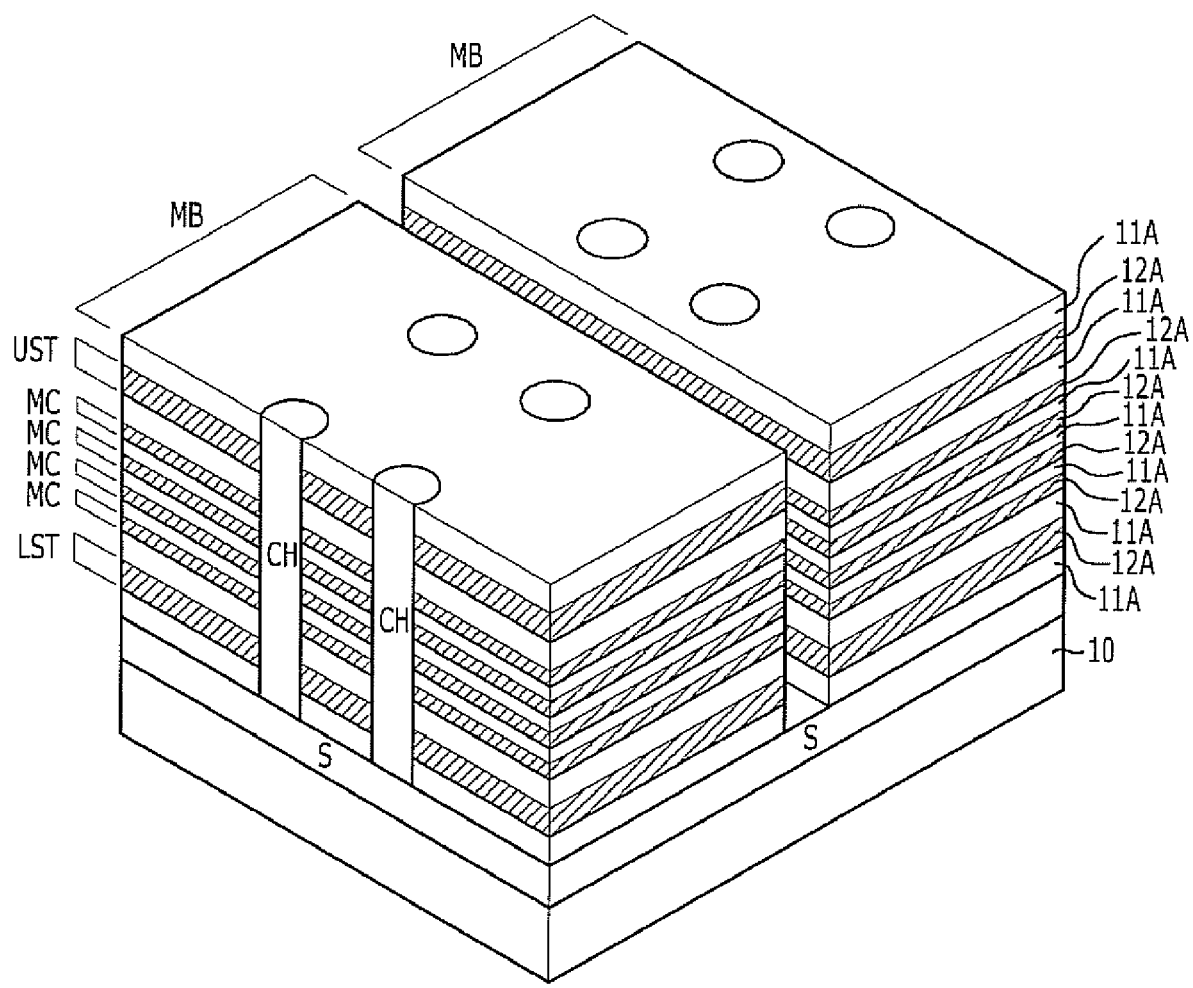
Figure 1C:
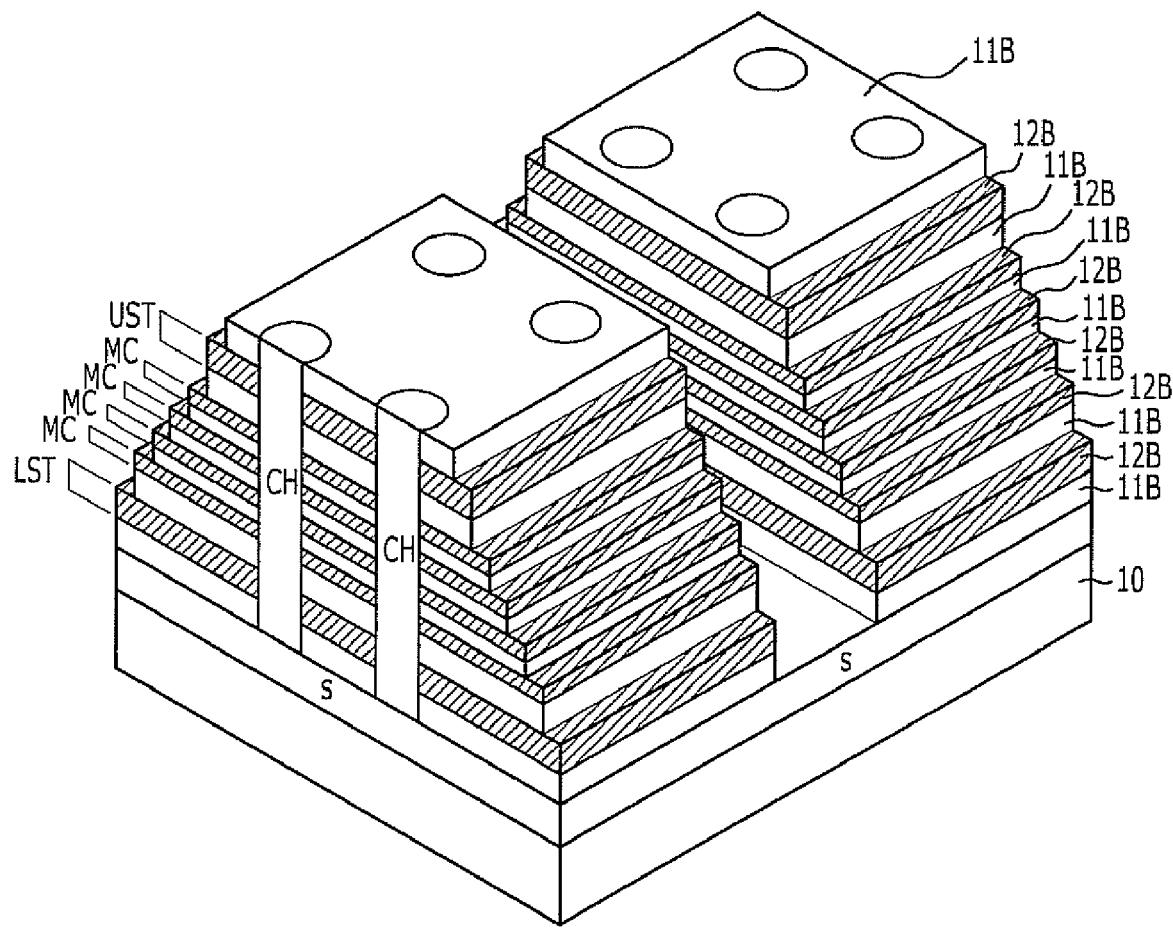

Other objects and advantages of the present invention can be understood by the following description, and become apparent with reference to the embodiments of the present invention.

Referring to the drawings, the illustrated thickness of layers and regions may have been exaggerated to facilitate explanation. When a first layer is referred to as being "on" a second layer or "on" a substrate, it could mean that the first layer is formed directly on the second layer or the substrate, or it could also mean that a third layer may exist between the first layer and the second layer or the substrate. Furthermore, the same or like reference numerals represent the same or like constituent elements, although they appear in different embodiments or drawings of the present invention.

FIGS. 2A to 2D are cross-sectional views illustrating an embodiment of a method for fabricating a vertical channel type non-volatile memory device.

Figure 2A:
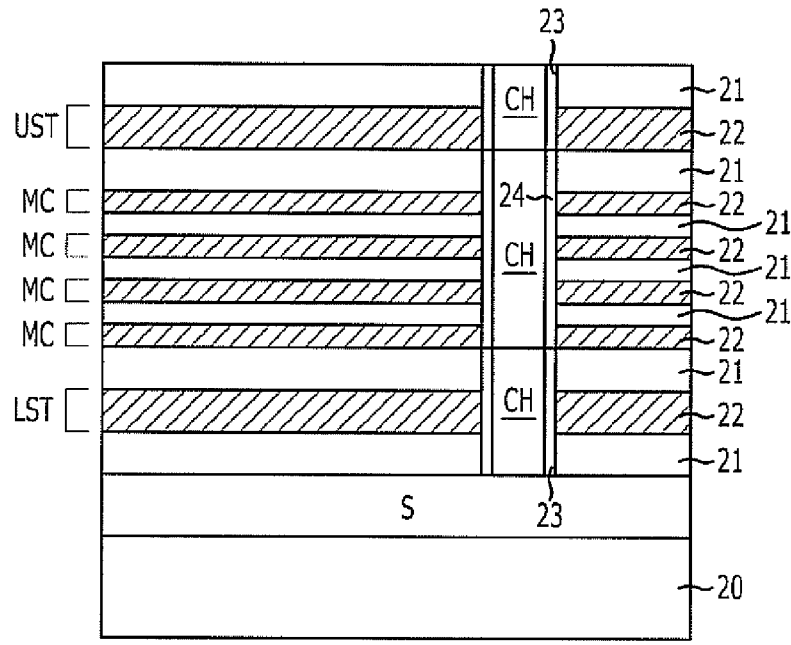
FIGS. 2A to 2D are cross-sectional views illustrating a method for fabricating a vertical channel type non-volatile memory device in accordance with an embodiment of the present invention.

Referring to FIG. 2A, a source region S is formed. Herein, the source region S may be formed by ion-implanting an impurity into a substrate 20 formed of monocrystalline silicon or formed of a conductive material. Also, the source region S may be formed by ion-implanting an impurity into a non-conductive material.

Subsequently, a lower selection transistor (LST), a plurality of memory cells MC, and an upper selection transistor (UST) are sequentially stacked over the substrate 20 with the source region S formed therein.

First, to form the LST, a plurality of interlayer dielectric layers 21 and a conductive layer 22 for a gate electrode are alternately formed over the substrate 20 with the source region S formed therein. Then, trenches are formed by etching the plurality of the interlayer dielectric layers 21 and the plurality of the conductive layers 22 for a gate electrode. Subsequently, gate insulation layer 23 is formed on internal walls of the trenches. Then, channels CH are formed by filling the trenches with a layer for channels.

Sequentially, a plurality of interlayer dielectric layers 21 and a plurality of conductive layers 22 for a gate electrode are alternately formed over the substrate 20 with the lower selection transistor formed thereon. Then, trenches are formed by etching the plurality of the interlayer dielectric layers 21 and the plurality of the conductive layers 22 for a gate electrode. Subsequently, a charge blocking layer, a charge trapping layer or a charge storage layer, and a tunnel insulation layer 24 are sequentially formed on internal walls of the trenches. Then, channels CH are formed by filling the trenches with a layer for channels. With this process, the plurality of memory cells MC are formed over the lower selection transistor LST.

Herein, the charge trapping layer or the charge storage layer are substantial data storages for storing data by inputting or outputting charges. The charge trapping layer or the charge storage layer is interposed between the charge blocking layer and the tunnel insulation layer according to a charge storing method. For example, the charge trapping layer stores data by trapping charges in a deep potential trap site, whereas the charge storage layer stores data by storing charges in a conductive band.

Sequentially, a plurality of interlayer dielectric layers 21 and a conductive layer 22 for a gate electrode are alternately formed over the substrate 20 with the LST and memory cells MC formed thereon. Then, trenches are formed by etching the plurality of the interlayer dielectric layers 21 and the conductive layer 22 for a gate electrode. Subsequently, gate insulation layer 23 is formed on internal walls of the trenches. Then, channels CH are formed by filling the trenches with a layer for channels. With this process, an upper selection transistor UST is formed over the plurality of memory cells MC and the lower selection transistor LST.

Thus, the lower selection transistor (LST), the plurality of memory cells MC, and the upper selection transistor (UST) are stacked along the channels CH protruding from the substrate 20.

Herein, the conductive layers 22 for a gate electrode of the lower selection transistor and the upper selection transistor may be formed in a thickness ranging from approximately 10 Å to approximately 1000 Å.

Meanwhile, the conductive layers 22 for a gate electrode of the memory cells MC may be formed in a thickness ranging from approximately 10 Å to approximately 500 Å.

The interlayer dielectric layers 21 may include an oxide layer, and the conductive layers 22 for a gate electrode may include polysilicon. Also, the channels CH may have a diameter ranging from approximately 10 Å to approximately 1000 Å and they may be formed through an epitaxial growth process.

Figure 2B:
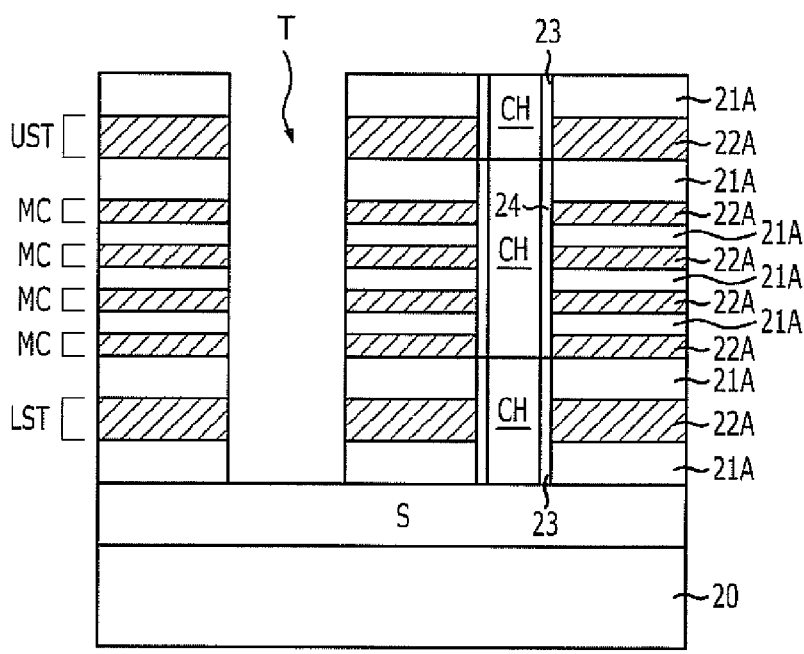

Referring to FIG. 2B, trenches T are formed by etching the plurality of the conductive layers 22 for a gate electrode and the plurality of the interlayer dielectric layers 21. Herein, the trenches T are for performing a silicidation process. The position and depth of the trenches T may be controlled based on what is silicided. Also herein, the interlayer dielectric layers 21 and the conductive layers 22 resulting from the trenches T are referred to with the reference labels 21A and 22A, respectively.

For example, when the conductive layers 22A for a gate electrode of the memory cells MC are to be silicided, the trenches T may be formed between the plurality of the channels CH to have a depth at least as deep as to expose the conductive layers 22A for a gate electrode of the memory cells MC formed in the lowermost portion.

Alternatively, for example, when the conductive layers 22A and the source region S are to be silicided, the trenches T may be formed to have a depth, at least as deep as to expose the surface of the source region S.

Otherwise, when the conductive layer 22A for a gate electrode of the upper selection transistor is to be silicided, the trenches T may be formed between the plurality of the channels CH to have a depth as deep as to expose the conductive layers 22A for a gate electrode of the upper selection transistor.

The drawing presents only one embodiment where the trenches T are formed to expose the source region S by etching the plurality of the conductive layers 22 for a gate electrode and the interlayer dielectric layers 21. When the trenches T are formed to expose the source region S, the conductive layers 22A for a gate electrode and the source region S may be silicided simultaneously.

Also, although no trenches T are separately formed for a silicidation process, gap regions between a plurality of memory blocks MB formed through an etching process for separating the plurality of the memory blocks MB may be used as a sort of trenches T. In other words, the gap regions separating the memory blocks MB, like the trenches T, may expose those elements that are to be silicided.

Figure 2C:
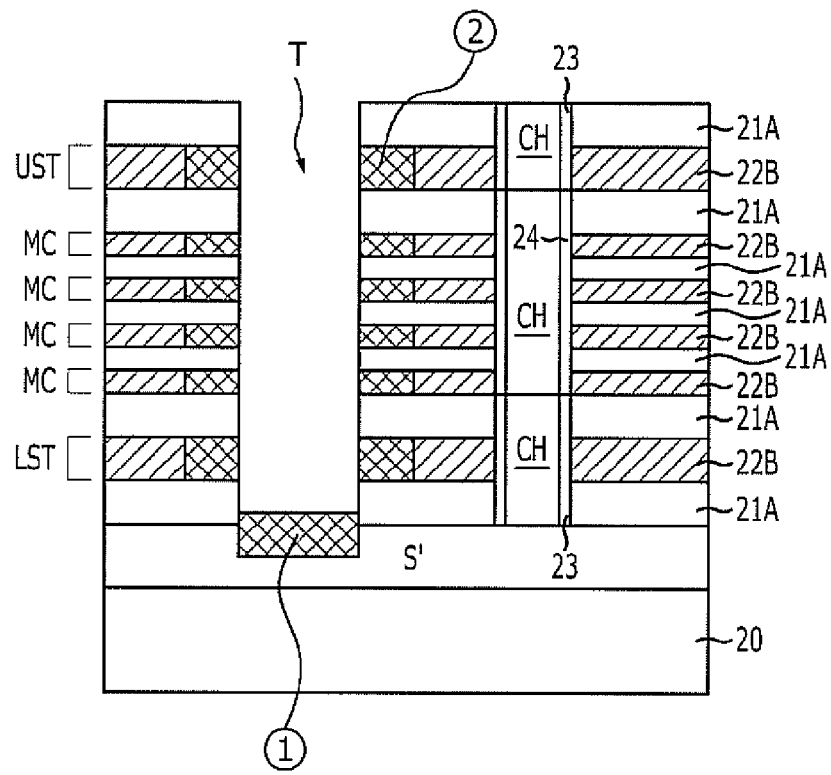

Referring to FIG. 2C, a portion of the conductive layers 22B for a gate electrode (labeled as region 2) and a portion of the source region S'(labeled as region 1) are silicided by performing a silicidation process onto the source region S and the conductive layers 22A for a gate electrode exposed through the trenches T. Herein, the source region S and the conductive layers 22A having undergone the silicidation process are referred to with the reference labels S' and 22B, respectively.

The silicidation process will be briefly described hereafter. First, the trenches T are filled with a metal layer (not shown). Herein, the metal layer may include nickel (Ni), cobalt (Co), or a combination of Ni and Co. Subsequently, the metal layer is induced to react with the conductive layers 22A for a gate electrode and the source region S by a thermal treatment. Herein, a portion of the source region S and a portion of the conductive layers 22A for a gate electrode exposed through the trenches T are silicided. Subsequently, the metal layer remaining unreacted during the thermal treatment is removed.

Figure 2D:
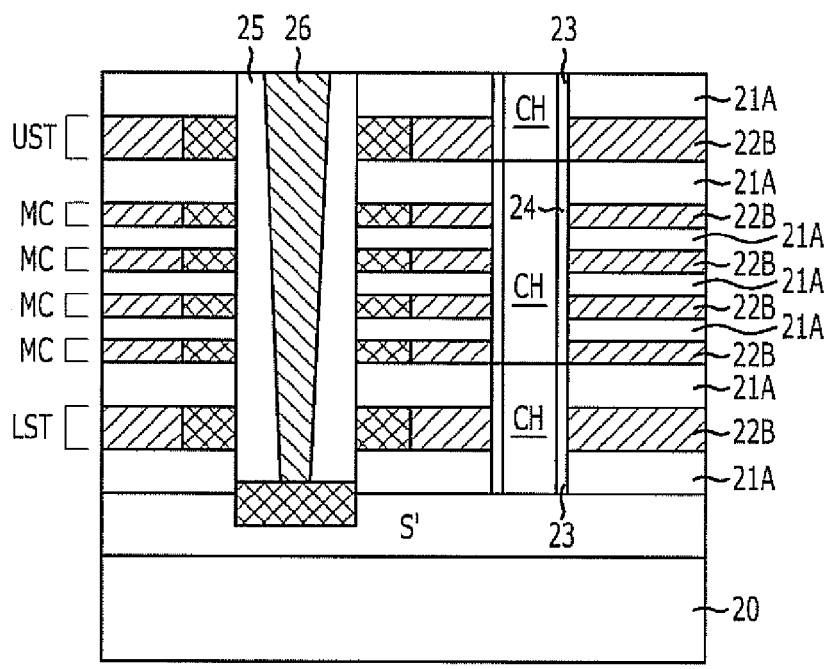

Referring to FIG. 2D, the trenches T are filled with an insulation layer 25. Then, second trenches (not labeled) which expose the silicided source region S' are formed by etching the insulation layer 25. Subsequently, the trenches are filled with a conductive layer to thereby form contact plugs 26 coupled with the source region S'.

According to the technology of the above-described embodiment, the vertical channel type non-volatile memory device including the source region S', the channels CH coupled with the source region S' and protruding from the substrate 20, and the plurality of memory cells MC stacked along the channels CH, may further include silicided portions in the source region S' and the conductive layers 22B for gate electrodes of the memory cells MC. Also, silicided portions in the conductive layers 22B for gate electrodes of the lower selection transistor and the upper selection transistor may be formed as well.

As described above, the resistance of a source select line, a word line, and a drain select line may be decreased by siliciding the gate electrodes of the lower selection transistor, the plurality of the memory cells MC, and the upper selection transistor. Therefore, it is possible to reduce the loading time when a memory device is driven, thus improving the driving speed.

Also, a resistance value may be decreased by siliciding a portion of the source region S. Therefore, contacts that decrease the resistance of the source region S do not have to be formed. As a result, the integration degree of the memory device may be improved.

Meanwhile, FIGS. 2A to 2D illustrate a case where the interlayer dielectric layers 21 and the conductive layers 22 for a gate electrode are directly stacked over the substrate. However, it is still possible to alternately stack the interlayer dielectric layers 21 and sacrificial layers, remove the sacrificial layers, and fill the space where the sacrificial layers used to be with the conductive layers 22 for a gate electrode.

Figure 3:
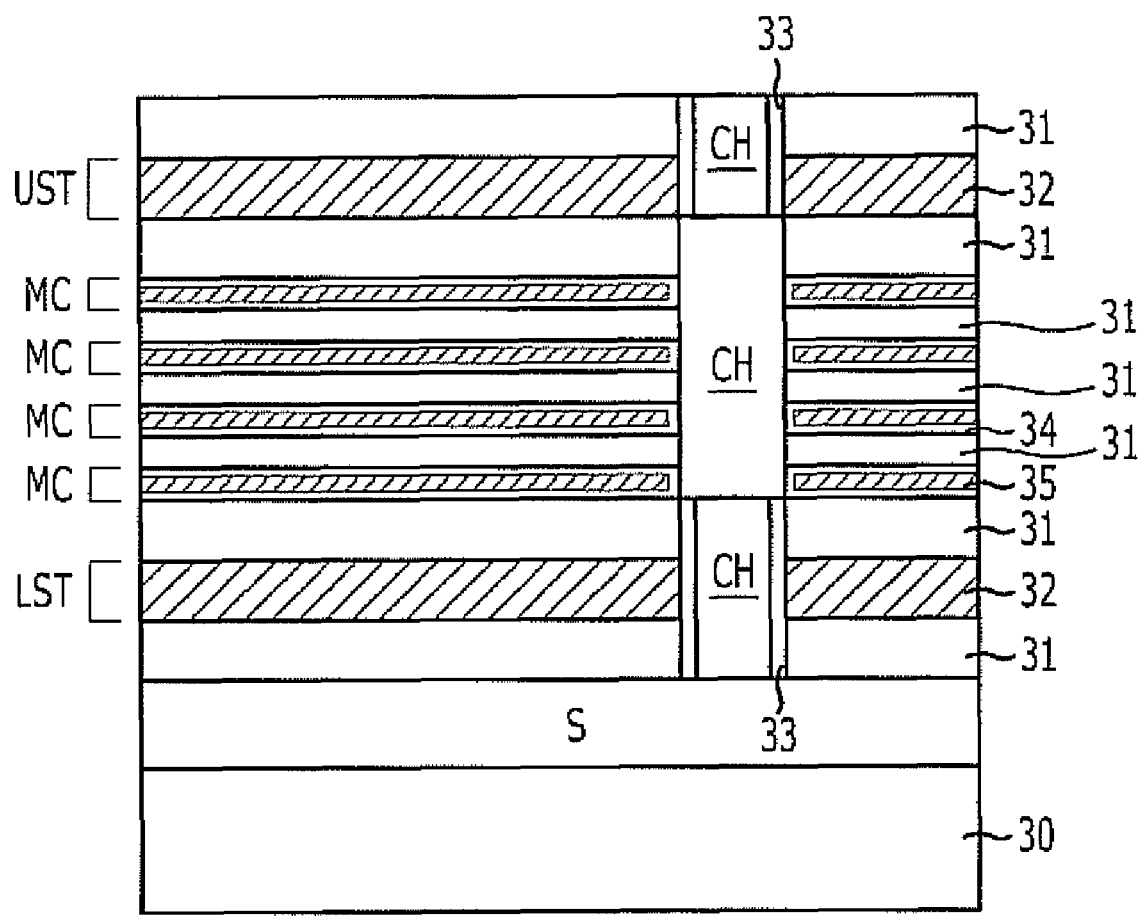
FIG. 3 is a cross-sectional view describing a method for fabricating a vertical channel type non-volatile memory device in accordance with an embodiment of the present invention.

FIG. 3 is a cross-sectional view describing a method for fabricating a vertical channel type non-volatile memory device in accordance with an embodiment of the present invention. The drawing corresponds to FIG. 2A. Referring to FIG. 3, a method for forming a plurality of memory cells by using sacrificial layers will be described and what is already described before will be omitted herein.

As shown in the drawing, a lower selection transistor (LST), a plurality of memory cells MC, and an upper selection transistor (UST) are sequentially formed over a substrate 30 with a source region S formed therein. Herein, the lower selection transistor and the upper selection transistor are formed in the same method as described earlier. In the drawing, a reference numeral '30' represents the substrate, and a reference numeral '31' represents an interlayer dielectric layer, while a reference numeral '32' represents a conductive layer for a gate electrode.

The plurality of the memory cells MC are formed as follows. First, a plurality of interlayer dielectric layers 31 and a plurality of sacrificial layers (not shown) are alternately formed over a substrate 30 with a source region S, and the interlayer dielectric layers 31 and the sacrificial layers are etched to thereby form trenches for channels. Subsequently, channels CH are formed by filling the trenches for channels with a layer for channels.

Subsequently, the plurality of the sacrificial layers are selectively removed while the interlayer dielectric layers 31 remain. For example, after the trenches are formed by etching the plurality of the interlayer dielectric layers 31 and the plurality of the sacrificial layers, the plurality of the sacrificial layers exposed through the inner walls of the trenches may be removed. Herein, the sidewalls of the channels CH are exposed at a predetermined interval in open regions formed as the sacrificial layers are removed.

Subsequently, a tunnel insulation layer, a charge trapping layer or a charge storage layer, and a charge blocking layer 34 are sequentially formed along the surface of the resultant substrate structure where the sidewalls of the channels CH are exposed at a predetermined interval. As a result, the tunnel insulation layer, the charge trapping layer or the charge storage layer, and the charge blocking layer 34 are formed over the channels CH exposed at the predetermined interval.

Subsequently, the open regions where the tunnel insulation layer, the charge trapping layer and the charge storage layer, and the charge blocking layer 34 are formed are filled with a conductive layer 35 for a gate electrode to thereby complete the formation of the plurality of the memory cells MC.

Subsequently, a silicide process is performed to silicide the plurality of the conductive layers 32 and 35 for a gate electrode or the source region S.

Although the present specification references a NAND flash device, which is a type of a non-volatile memory device, this is only for the sake of convenience in explanation, and the concept and scope of the present disclosure are not limited to it. In other words, the embodiments of the present invention may be applied not only to the NAND flash device, but also to a Dynamic Random Access Memory (DRAM) device and a NOR flash device having a three-dimensional structure.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a vertical channel type nonvolatile memory device, comprising:
    forming a source region;
    alternately forming a plurality of interlayer dielectric layers and a plurality of conductive layers for a gate electrode over a substrate with the source region formed therein;
    forming a trench exposing the source region by etching the plurality of interlayer dielectric layers and the plurality of conductive layers for a gate electrode; and
    siliciding a portion of the conductive layers for a gate electrode and a portion of the source region that are exposed through the trench.

2. The method of claim 1, further comprising:
    forming a channel trench by etching the plurality of the interlayer dielectric layers and the plurality of the conductive layers for a gate electrode;
    sequentially forming a charge blocking layer, a charge trapping layer or a charge storage layer, and a tunnel insulation layer on an internal wall of the channel trench; and
    forming a channel by filling the channel trench with a layer for a channel.

3. The method of claim 1, wherein the forming of the trench exposing the source region,
    a plurality of memory blocks are separated from each other by etching the plurality of the interlayer dielectric layers and the plurality of the conductive layers for a gate electrode.

4. The method of claim 1, wherein the siliciding of the conductive layers for a gate electrode and the source region that are exposed through the trench includes:
    filling the trench with a metal layer;
    reacting the conductive layers for a gate electrode, the source region, and the metal layer through a thermal treatment; and
    removing the metal layer that remains unreacted after the thermal treatment.

5. The method of claim 4, further comprising:
    filling the trench with an insulation layer, after the siliciding of the conductive layers for a gate electrode and the source region;
    forming a second trench exposing the silicided source region by etching the insulation layer; and
    forming a contact plug by filling the second trench with a conductive layer.

6. The method of claim 1, wherein the alternately forming of the plurality of the interlayer dielectric layers and the plurality of the conductive layers for a gate electrode over the substrate with the source region formed therein comprises:
    alternately forming the plurality of the interlayer dielectric layers and a plurality of sacrificial layers over the substrate;
    forming a channel trench by etching the plurality of the interlayer dielectric layers and the plurality of the sacrificial layers;
    forming a channel by filling the channel trench with a layer for a channel;
    exposing sidewalls of the channel by removing the plurality of the sacrificial layers; and
    filling the exposed sidewalls with a conductive layer for a gate electrode.

7. The method of claim 6, further comprising:
    sequentially forming a tunnel insulation layer, a charge trapping layer or a charge storage layer, and a charge blocking layer on the internal sidewalls of the channel trench, before forming the channel.

8. The method of claim 1, further comprising:
    forming a channel trench by etching the plurality of the interlayer dielectric layers and the plurality of the conductive layers for a gate electrode;
    forming a gate insulation layer on an internal wall of the channel trench; and
    forming a channel by filling the channel trench with a layer for a channel.

* * * * *